United States Patent
Hwang

(10) Patent No.: US 8,841,657 B2
(45) Date of Patent: Sep. 23, 2014

(54) ORGANIC DISPLAY DEVICE AND MANUFACTURING METHOD THEREOF

(75) Inventor: Tai-Jiun Hwang, Guangdong (CN)

(73) Assignee: Shenzhen China Star Optoelectronics Technology Co., Ltd., Guangdong (CN)

(*) Notice: Subject to any disclaimer, the term of this patent is extended or adjusted under 35 U.S.C. 154(b) by 198 days.

(21) Appl. No.: 13/639,213

(22) PCT Filed: Aug. 16, 2012

(86) PCT No.: PCT/CN2012/080240
§ 371 (c)(1),
(2), (4) Date: Oct. 4, 2012

(87) PCT Pub. No.: WO2014/023039
PCT Pub. Date: Feb. 13, 2014

(65) Prior Publication Data
US 2014/0034910 A1    Feb. 6, 2014

(30) Foreign Application Priority Data
Aug. 6, 2012    (CN) .................. 2012 1 0284322

(51) Int. Cl.
*H01L 35/24* (2006.01)

(52) U.S. Cl.
USPC ................... 257/40; 257/E51.001

(58) Field of Classification Search
USPC ............................. 257/40, E51.001
See application file for complete search history.

(56) References Cited

U.S. PATENT DOCUMENTS

| 7,915,102 B2* | 3/2011 | Hwang et al. | 438/160 |
| 2005/0179374 A1* | 8/2005 | Kwak | 313/506 |
| 2006/0292763 A1* | 12/2006 | Hwang et al. | 438/154 |
| 2007/0159077 A1* | 7/2007 | Kim | 313/504 |
| 2008/0218091 A1* | 9/2008 | Jo et al. | 315/169.3 |

* cited by examiner

Primary Examiner — Anthony Ho
(74) Attorney, Agent, or Firm — Kirton McConkie; Evan R. Witt

(57) ABSTRACT

An organic display device and a method of manufacturing method thereof are provided. The organic display device includes scan lines, data lines and power lines. Portions crossed and defined by the scan lines, the data lines and the power supply lines are provide with display regions. The display region is formed with an organic light emitting diode. The organic light emitting diode includes an anode layer, and a conductive layer is formed on the power supply line. The anode layer of the organic light emitting diode and the conductive layer are etched and formed on the same basis of a material layer.

15 Claims, 4 Drawing Sheets

US 8,841,657 B2

ORGANIC DISPLAY DEVICE AND MANUFACTURING METHOD THEREOF

FIELD OF THE INVENTION

The present invention relates to a field of display technology, and more particularly to an organic display device and a manufacturing method thereof.

BACKGROUND OF THE INVENTION

The organic electroluminescence display (OELD) is a new generation of display device which generally adapts organic light emitting diodes (OLED) as light-emitting display components.

The organic light emitting diodes emit light by sandwiching the organic light-emitting material between the transparent anode and the metal reflecting cathode and applying a voltage to the organic light-emitting material. Because the organic electroluminescence displays do not require the liquid crystals and the conventional backlight modules, they can be manufactured thinner. Compared with other type of flat display devices, the OLEDs consume less power, work in the wider range of temperatures and cost lower, and therefore they are used more and more widely.

Please referring to FIG. 1, FIG. 1 is a cross-sectional structural view of a traditional display device of the prior art, and FIG. 2 is a top structural view of the display device.

In FIG. 2, there are data lines 101, scan lines 102, and power lines 103. And the portions which are crossed and defined by them are provided with element regions 18 and display regions 19. Please referring to FIG. 1, a switching device 12 is formed in the element region 18 and on the transparent substrate 11. And, the display region 19 is formed with an OLED which includes a transparent substrate 11, an anode layers 13, a hole transport layers 14, an organic light-emitting layers 15, an electron transport layer 16, and a cathode layer 17 from top to bottom.

The organic display device shown in FIGS. 3 and 4 is an active organic display device, which includes an organic light emitting diode mainly driven by the transmitting current of power lines. To ensure that the current can be transmitted to each of the organic light emitting diodes, the width L1 of the power lines is generally larger, so that the presence of voltage drops in the transmission process results in different brightness of each of the organic light emitting diodes and thus reduces the display quality.

Furthermore, if the width L1 of the power lines is generally larger, they will occupy the space of the display regions 19, and reduce the transmittance of the organic display device to affect the display quality.

Therefore, it is necessary to solve the problems existing in the conventional technologies, as described above.

SUMMARY OF THE INVENTION

An object of the present invention is to provide an organic display device, to solve the problems existing in the conventional technologies, i.e. the width of the power lines is wider to reduce the transmittance of the organic display device, and the presence of voltage drops in the current transmission process results in different brightness of each of the organic light emitting diodes.

In order to solve the problems described above, the present invention provides an organic display device which comprises: scan lines, data lines, and power lines, wherein portions crossed and defined by the scan lines, the data lines and the power lines include display regions and element regions;
wherein the display region is provide with an organic light emitting diode which includes an anode layer; and a conductive layer is formed on the power line, wherein the anode layer of the organic display device and the conductive layer are etched to form on the same basis of a material layer, which includes: at least one conductive metal layer, and at least one light transmissive transparent conductive oxide layer stacked with each other.

In one embodiment of the present invention, the conductive layer includes at least one metal layer, and the anode layer is formed by a transparent conductive oxide layer.

In one embodiment of the present invention, the material layer includes a first transparent conductive oxide layer, a metal layer and a second transparent conductive oxide layer stacked with each other in turn; and
wherein the conductive layer includes the first transparent conductive oxide layer, the metal layer and the second transparent conductive oxide layer; and the anode layer is formed by the first transparent conductive oxide layer.

In one embodiment of the present invention, the material of the transparent conductive oxide layer is indium tin oxide, and the material of the metal layer is copper.

In one embodiment of the present invention, the element region is provided with a switching device, which is connected with the scan line, the data line, the power line and the organic light emitting diode, respectively, for controlling the power-on/off of the organic light emitting diode.

Another object of the present invention is to provide an organic display device to solve the problems existing in the conventional technologies, i.e. the width of the power lines is wider to reduce the transmittance of the organic display device, and the presence of voltage drops in the current transmission process results in different brightness of each of the organic light emitting diodes.

To solve the problems described above, the present invention provides an organic display device which comprises: scan lines, data lines, and power lines, wherein portions crossed and defined by the scan lines, the data lines and the power lines include display regions;
wherein the display region includes an organic light emitting diode which includes an anode layer; and a conductive layer is formed on the power line, wherein the anode layer of the organic display device and the conductive layer are etched to form on the same basis of a material layer.

In one embodiment of the present invention, the material layer includes: at least one conductive metal layer and at least one light transmissive transparent conductive oxide layer stacked with each other;
the conductive layer includes at least one metal layer, and the anode layer is formed by a transparent conductive oxide layer.

In one embodiment of the present invention, the material layer includes a first transparent conductive oxide layer, a metal layer and a second transparent conductive oxide layer stacked with each other in turn; and
the conductive layer includes a first transparent conductive oxide layer, a metal layer and a second transparent conductive oxide layer; and the anode layer is formed by the first transparent conductive oxide layer.

In one embodiment of the present invention, the material of the transparent conductive oxide layer is indium tin oxide, and the material of the metal layer is copper.

In one embodiment of the present invention, the portions crossed and defined by the scan lines, the data lines and the power lines further include element regions, the element region is provided with a switching device which is connected with the scan line, the data line, the power line and the organic light emitting diode, respectively, for controlling the power-on/off of the organic light emitting diode.

Further another object of the present invention is to provide an organic display device to solve the problems existing in the conventional technologies, i.e. the width of the power lines is wider to reduce the transmittance of the organic display device, and the presence of voltage drops in the current transmission process results in different brightness of each of the organic light emitting diodes.

In order to solve the problems described above, the present invention provides a manufacturing method of an organic display device, which comprises the following steps of:
  supporting a transparent substrate, and forming scan lines, data lines and power lines on the transparent substrate, wherein portions crossed and defined with the scan lines, the data lines and the power lines include display regions;
  coating a material layer on the transparent substrate which is formed with the scan lines, the data lines and the power lines, and etching the material layer to form a conductive layer on the power line and form a light transmissive anode layer in the display region of the transparent substrate; and
  forming a hole transport layer, an organic light-emitting layer, an electron transport layer, and a cathode layer on the transparent substrate which is formed with the anode layer in turn, so as to form an organic light emitting diode in the display region of the transparent substrate.

In one embodiment of the present invention, the material layer includes: at least one conductive metal layer and at least one light transmissive transparent conductive oxide layer stacked with each other; the conductive layer includes at least one metal layer, and the anode layer is formed by a transparent conductive oxide layer.

In one embodiment of the present invention, the material layer includes a first transparent conductive oxide layer, a metal layer and a second transparent conductive oxide layer stacked with each other in turn; the conductive layer includes the first transparent conductive oxide layer, the metal layer and the second transparent conductive oxide layer, and the anode layer is formed by the first transparent conductive oxide layer.

In one embodiment of the present invention, the material of the transparent conductive oxide layer is indium tin oxide, and the material of the metal layer is copper.

In one embodiment of the present invention, the portions crossed and defined by the scan lines, the data lines and the power lines further include element regions;
  wherein during forming the scan lines, the data lines and the power lines, the element region is further formed with a switching device, which is connected to the scan line, the data line, the power line and the organic light emitting diode, respectively, for controlling the power-on/off of the organic light emitting diode.

In comparison with the prior art, in the forming process of the anode layer of the organic light emitting diode of the present invention, coating the whole transparent substrate with a material layer, and then etching the material layer by a photomask process, so that the material layer corresponding to the power line is used to form a conductive layer to achieve conduction function; and the material layer corresponding to the display region is used to form an anode layer. Because the conductive layer is conductive, the conductive layer can share the conductive function of the power line and thus reduce the volume of the power line. For example, the width of the power line can be reduced to increase the opening ratio of the organic display device, and thus the problem of voltage drops can be avoid, so that each of the organic light emitting diodes has uniformly light.

In order to clarify and simplify the above description of the present invention, the following contents held specially the preferred embodiment with the accompanying drawings as described in detail as following:

DETAILED DESCRIPTION OF THE PREFERRED EMBODIMENTS

The following descriptions of the embodiments illustrate the specific implementation of the embodiment according the present invention by referring to the attached drawings. Directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto. In the figures, the units which have the similar structures are represented by the same numeral.

Figure 4:
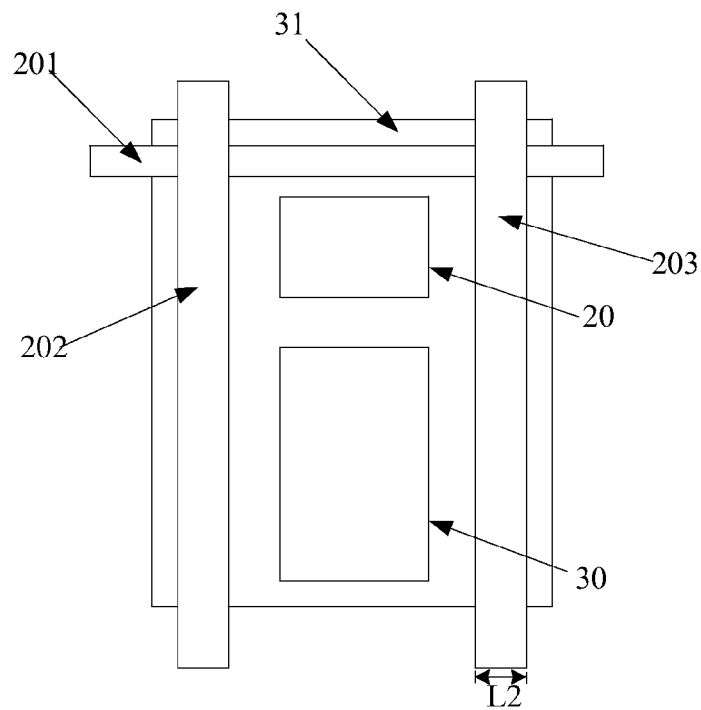
FIG. 4 is a top structural view of the organic display device according to the preferred embodiment of the present invention.

FIG. 4 is a top structural view of the organic display device according to a preferred embodiment of the present invention. The organic display device comprises data lines 201, scan lines 202, and power lines 203, which are formed on the same layer by the same manufacturing process. The portions crossed and defined by the data lines 201, the scan lines 202 and the power lines 203 include element regions 20 and display regions 30.

Figure 3:
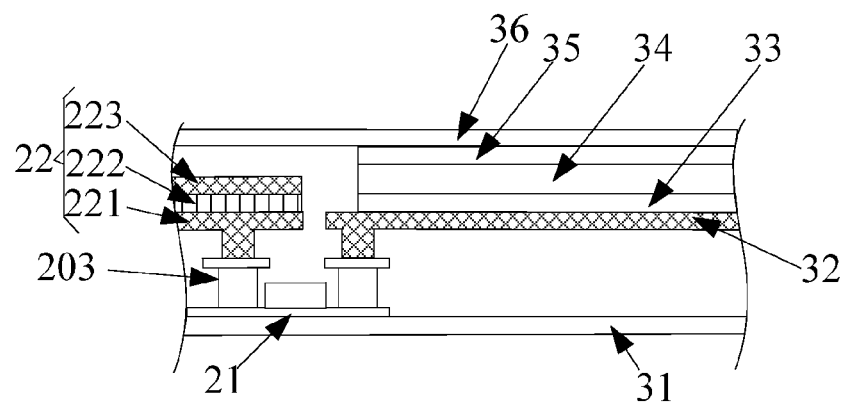
FIG. 3 is a cross-sectional structural view of the organic display device according to a preferred embodiment of the present invention.

FIG. 3 is a cross-sectional structural view corresponding to the element regions 20 and the display regions 30 in FIG. 4, wherein each of the element regions 20 is provided with a switching device 21 which is, for example, the thin film transistor (TFT), and a conductive layer 22 is formed on each of the power lines 203. Specifically, the conductive layer 22 is further formed on the switching device 21, the scan line 201 and the data line 202. In the embodiment shown in FIG. 3, the conductive layer 22 includes a first transparent conductive oxide layer 221, a metal layer 222 and a second transparent conductive oxide layer 223 in turn.

Please referring to FIG. 3 again, the display region 30 is provided with an organic light emitting diode, which comprises the following components: a transparent substrate 31, an anode layer 32, a hole transport layer 33, an organic light-emitting layer 34, an electron transport layer 35 and a cathode layer 36. Under the bias condition, electrons from the cathode layer 36 are recombined with holes from the anode layer 32 in the organic light-emitting layer 34, so that the organic light-emitting layer 34 emits light which sequentially passes through the hole transport layer 33, the anode layer 32 and the transparent substrate 31.

In the present invention, the switching devices 21, the scan lines 201, the data lines 202, and the power lines 203 are formed between the transparent 31 and the conductive layer 22, and can be formed in the same manufacturing process. And the conductive layer 22 and the anode layer 32 of the organic light emitting diode are formed on the same basis of a material layer. The first transparent conductive oxide layer 221 and the second transparent conductive oxide layer 223 of the conductive layer 22 and the anode layer 32 of the organic light emitting diode are formed by the same material which is, for example, indium tin oxide, and light can transmit there through. The metal layer 222 of the conductive layer 22 is formed by the conductive material which is, for example, copper.

Figure 5A:
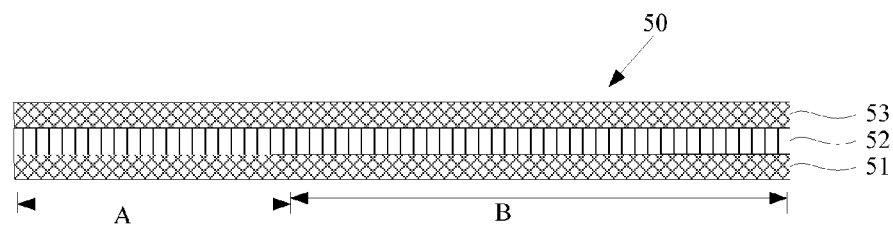
FIGS. 5A-5C are schematic illustrations of the present invention when etching a material layer to form a conductive layer and an anode layer.
Figure 5B:
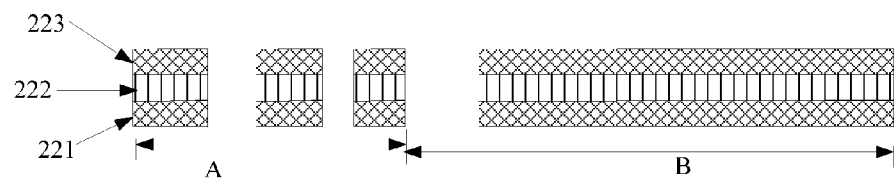
Figure 5C:
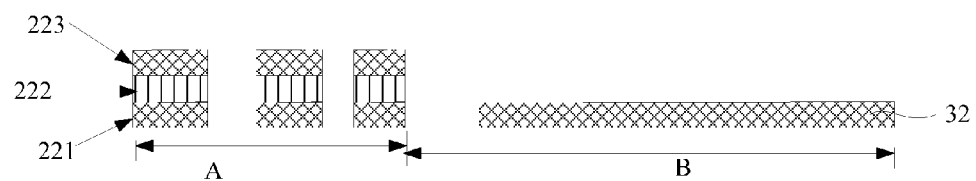

Please also referring to FIGS. 5A-5C, FIGS. 5A-5C are the schematic illustrations showing the conductive layer 22 and the anode layer 32 of the organic light emitting diode which is formed on the same basis of a material layer.

In FIG. 5A, please also referring to FIG. 3, the switching devices 21, the scan lines 201, the data lines 202 and the power lines 203 are formed on the transparent substrate 31, and then the transparent substrate 31 is coated with the material layer 50 which includes the first transparent conductive oxide layer 51, the metal layer 52, and the second transparent conductive oxide layer 53.

In FIG. 5B, a first etching process of the material layer 50, such as a photolithographic etching process, includes the following steps of: forming a photoresist layer on the material layer 50 and then etching the material layer 50 by irradiating with light, so as to form the structure as shown in FIG. 5B, wherein the metal layer 50 in a region A corresponding to the power line 203 is used to form the first transparent conductive oxide layer 221, the metal layer 222 and the second transparent conductive oxide layer 223 of the conductive layer 22, and the organic light emitting diode is formed in a regions B. The material layer 50 of the region B still includes the first transparent conductive oxide layer 51, the metal layer 52, and the second transparent conductive oxide layer 53.

In FIG. 5C, a second photolithographic etching process of the material layer 50 includes the following steps of: coating a photoresist layer on the formed conductive layers 22, and then etching by light exposure, so that the material layer 50 of the regions B retains only the first transparent conductive oxide layer 51 to form the anode layer 32 of the organic light emitting diode.

From the above description, we can easily understand that during forming the anode layer 32 of the organic light emitting diode, the present invention includes the steps of: coating the whole transparent substrate 31 with a material layer 50, wherein the material layer 50 includes at least one transparent conductive oxide layer and at least one conductive metal layer; and then etching the material layer 50 by a photomask process, so that the material layer 50 corresponding to the power line 203 retains only at least one transparent conductive oxide layer and at least one metal layer as the conductive layers 22 to achieve conductive function; and the material layer 50 corresponding to the display region 30 retains only a transparent conductive oxide layer as the anode layer 32.

Figure 1:
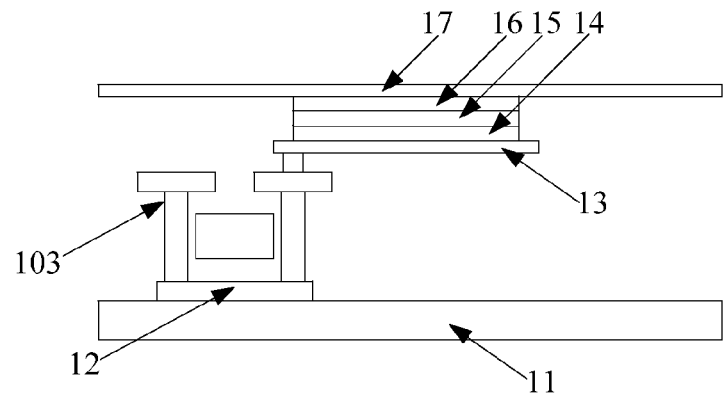
FIG. 1 is a cross-sectional structural view of an organic display device of prior art.
Figure 2:
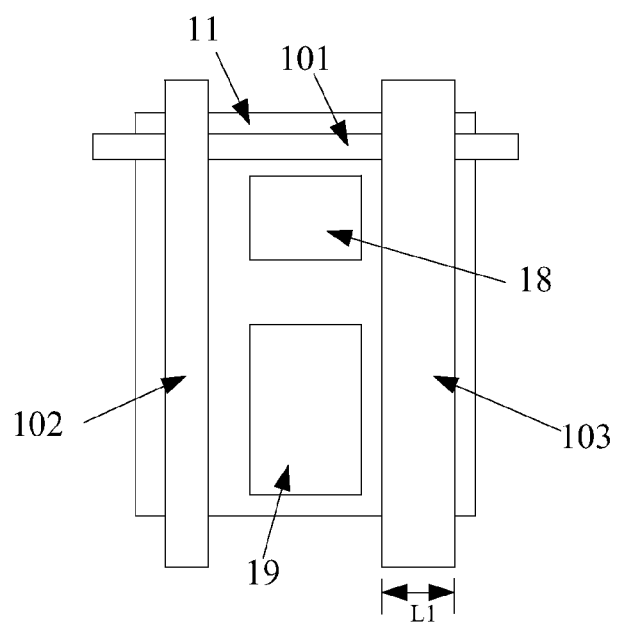
FIG. 2 is a top structural view of the organic display device of prior art.

Because the conductive layers 22 are electro-conductive, the conductive layer 22 can share the conductive function of the power lines 203, and thus reduce the volume of the power lines 203. For example, the width L2 of the power lines can be reduced, wherein L2 is smaller than L1 (please also referring to FIG. 2), and then the opening ratio of the organic display devices can be increased and thus the life of the panel can be enhanced. Because the width L2 of the power lines become smaller, the problem of large voltage drops can be avoid, and thus each of the organic light emitting diodes have uniformly light to improve the display uniformity of the panel.

In some other embodiments, the material layer 50 can also be other multi-layer construction, such as a two-layer construction, which includes a transparent conductive oxide layer and a metal layer. It, of cause, can be a four-layer construction, which includes a transparent conductive oxide layer, a metal layer, a transparent conductive oxide layer and a metal layer, etc. All cases are allowed in the following conditions that the anode layer 32 can be etched to form in the display regions 30 and the conductive layer 22 can be etched to form on the power line 203, and thus are within the scope of protection of the present invention and they are not enumerated herein.

Figure 6:
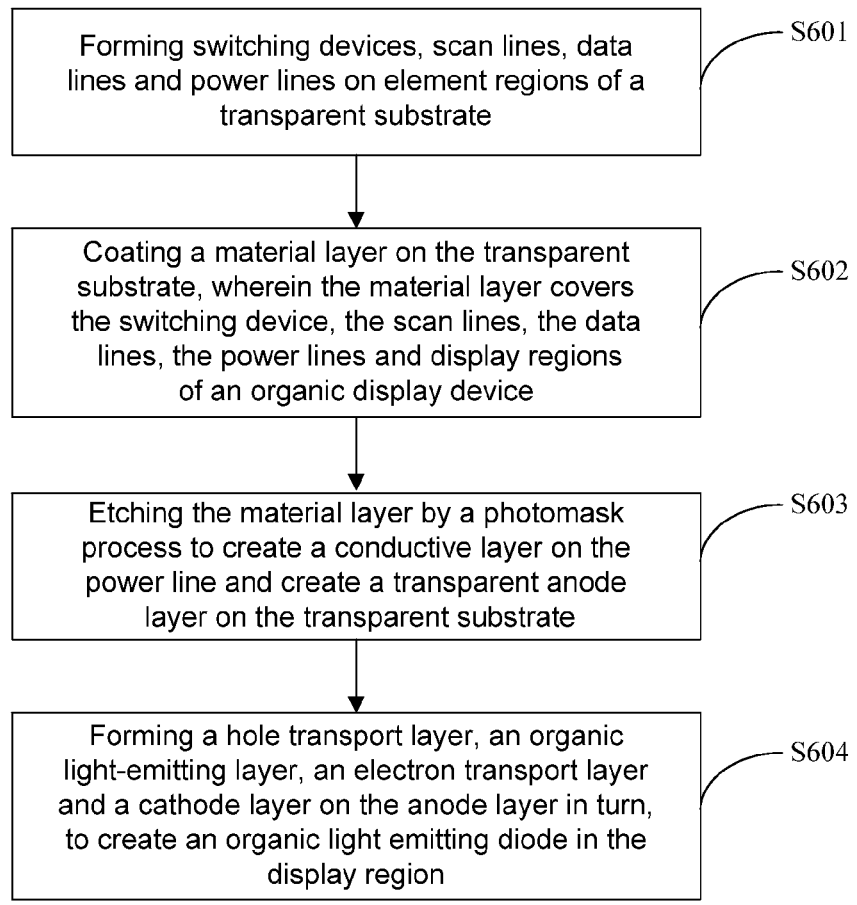
FIG. 6 is a flowchart of a manufacturing method of the organic display device according to the preferred embodiment of the present invention.

FIG. 6 is a flowchart of a manufacturing method of the organic display device according to the preferred embodiment of the present invention.

In the step S601, providing a transparent substrate 31, and forming switching devices 21, scan lines 201, data lines 202 and power lines 203 in an element regions 21 of the transparent substrate 31, wherein the switching device 21 is, for example, a TFT transistor.

In the step S602, coating the material layer 50 on the transparent substrate 31, wherein the switching device 21, the scan line 201, the data line 202, the power line 203 and the display region 30 of the organic display device (shown in FIG. 4) are covered by the material layer 50.

In the step S603, etching the material layer 50 by a photomask process to create a conductive layer 22 on the power line 203 and create a light transmissive anode layer 32 on the corresponding display region of the transparent substrate 31,
    wherein the conductive layer 22 and the power line 203 are conductive and thus the width L2 of the power line 203 can be designed to be smaller.

In the step S604, forming a hole transport layer 33, an organic light-emitting layer 34, an electron transport layer 35 and a cathode layer 36 on the anode layers 32 in turn, so as to create an organic light emitting diode,
    wherein the material layer 50 is a multi-layer construction which includes at least one transparent conductive oxide layer and at least one conductive metal layer. For example, the material of the transparent conductive oxide layer is indium tin oxide and the material of the metal layer is copper.

In the present invention, the material 50 can be a two-layer construction, which includes a transparent conductive oxide layer and a metal layer. It also could be a three-layer construction. Referring to FIGS. 5A-5C, for example, it includes the first transparent conductive oxide layer 51, the metal layer 52 and the second transparent conductive oxide layer 53. All cases are allowed in the following conditions that the anode layers 32 can be etched to form in the display regions 30 and the conductive layers 22 can be etched to form on the power lines 203, and thus are within the scope of protection of the present invention and they are not enumerated herein.

In the production process of the anode layer of the organic light emitting diode, the present invention includes the steps of: coating the whole transparent substrate with a material layer, and then etching the material layer by a photomask process, so that the material layer corresponding to the power lines is formed as the conductive layer to achieve conductive function; and the material layer corresponding to the display regions is formed as the anode layer. Because the conductive layer is conductive and can share the conductive function of the power lines and thus reduce the volume of the power lines. For example, the width of the power lines can be reduced to increase the opening ratio of the organic display devices. Therefore, the problem of voltage drops can be avoided, so that each of the organic light emitting diodes has uniformly light.

The present invention has been described with a preferred embodiment thereof and it is understood that many changes and modifications to the described embodiment can be carried out without departing from the scope and the spirit of the invention that is intended to be limited only by the appended claims.

What is claimed is:

1. An organic display device, comprising scan lines, data lines and power lines, wherein portions crossed and defined by the scan lines, the data lines and the power lines include display regions and element regions;
   wherein the display region includes an organic light emitting diode which include an anode layer; and a conductive layer is formed on the power line; and
   wherein the anode layer of the organic display device and the conductive layer are etched and formed on the same basis of a material layer, the material layer includes at least one conductive metal layer and at least one light transmissive transparent conductive oxide layer stacked with each other.

2. The organic display device according to claim 1, wherein the conductive layer includes at least one metal layer; and the anode layer is formed by a transparent conductive oxide layer.

3. The organic display device according to claim 2, wherein the material layer includes a first transparent conductive oxide layer, a metal layer and a second transparent conductive oxide layer stacked with each other in turn;
   wherein the conductive layer includes the first transparent conductive oxide layer, the metal layer and the second transparent conductive oxide layer; and the anode layer is formed by the first transparent conductive oxide layer.

4. The organic display device according to claim 2, wherein material of the transparent conductive oxide layer is indium tin oxide, and material of the metal layer is copper.

5. The organic display device according to claim 1, wherein the element region is provided with a switching device, which is connected to the scan line, the data line, the power line and the organic light emitting diode, respectively, for controlling the power-on/off of the organic light emitting diode.

6. An organic display device, comprising scan lines, data lines and power lines, wherein portions crossed and defined by the scan lines, the data lines and the power lines include display regions;
   wherein the display region includes an organic light emitting diode which includes an anode layer; and a conductive layer is formed on the power line;
   wherein the anode layer of the organic display device and the conductive layer is etched and formed on the same basis of a material layer.

7. The organic display device according to claim 6, wherein the material layer includes at least one conductive metal layer and at least one light transmissive transparent conductive oxide layer stacked with each other;
   wherein the conductive layer includes at least one metal layer; and the anode layer is formed by a transparent conductive oxide layer.

8. The organic display device according to claim 7, wherein the material layer includes a first transparent conductive oxide layer, a metal layer and a second transparent conductive oxide layer stacked with each other in turn;
   wherein the conductive layer includes a first transparent conductive oxide layer, the metal layer and a second transparent conductive oxide layer; and the anode layer is formed by the first transparent conductive oxide layer.

9. The organic display device according to claim 7, wherein material of the transparent conductive oxide layer is indium tin oxide, and material of the metal layers is copper.

10. The organic display device according to claim 6, wherein the portions crossed and defined by the scan lines, the data lines and the power lines further include element regions, the element region is provided with a switching device which is connected to the scan line, the data line, the power line and the organic light emitting diode, respectively, for controlling the power-on/off of the organic light emitting diode.

11. A manufacturing method of an organic display device, comprising steps of:
   supporting a transparent substrate, and forming scan lines, data lines and power lines on the transparent substrate, wherein portions crossed and defined with the scan lines, the data lines and the power lines include display regions;
   coating a material layer on the transparent substrate which is formed with the scan lines, the data lines and the power lines, and etching the material layer to form a conductive layer on the power line and form a light transmissive anode layer on the display region of the transparent substrate; and
   forming a hole transport layer, an organic light-emitting layer, an electron transport layer and a cathode layer on the transparent substrate which is formed with the anode layer in turn, so as to form an organic light emitting diode in the display region of the transparent substrate.

12. The manufacturing method of the organic display device according to claim 11, wherein the material layer includes at least one conductive metal layer and at least one light transmissive transparent conductive oxide layer stacked with each other; the conductive layer includes at least one metal layer; and the anode layers are formed by a transparent conductive oxide layer.

13. The manufacturing method of the organic display device according to claim 12, wherein the material layer includes a first transparent conductive oxide layer, a metal layer and a second transparent conductive oxide layer stacked with each other in turn; wherein the conductive layer includes the first transparent conductive oxide layer, the metal layer and the second transparent conductive oxide layer; and the anode layer is formed by the first transparent conductive oxide layer.

14. The manufacturing method of the organic display device according to claim 12, wherein the material of the transparent conductive oxide layer is indium tin oxide, and the material of the metal layers is copper.

15. The manufacturing method of the organic display device according to claim 11, wherein the portions crossed and defined by the scan lines, data lines and power lines further include element regions;
   wherein during forming the scan lines, the data lines and the power lines, the element region is further formed with a switching device, which is connected to the scan line, the data line, the power line and the organic light emitting diode, respectively, for controlling the power-on/off of the organic light emitting diode.

* * * * *